United States Patent
McCormick et al.

(10) Patent No.: US 6,943,446 B2
(45) Date of Patent: Sep. 13, 2005

(54) VIA CONSTRUCTION FOR STRUCTURAL SUPPORT

(75) Inventors: John P. McCormick, Palo Alto, CA (US); Ivor G. Barber, Los Gatos, CA (US); Kumar Nagarajan, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 38 days.

(21) Appl. No.: 10/290,953

(22) Filed: Nov. 8, 2002

(65) Prior Publication Data

US 2004/0089953 A1 May 13, 2004

(51) Int. Cl.$^7$ .......... H01L 23/34; H01L 23/48; H01L 23/52
(52) U.S. Cl. .......... 257/728; 257/774; 257/773; 257/737; 257/738; 257/734; 257/778; 257/724; 257/725; 257/691; 257/698; 257/207; 257/208; 257/211
(58) Field of Search .......... 257/774, 773, 257/680, 778, 734, 737, 738, 728, 724, 725, 691, 696, 698, 207, 208, 211

(56) References Cited

U.S. PATENT DOCUMENTS

| | | | | | |
|---|---|---|---|---|---|
| 5,483,421 | A | * | 1/1996 | Gedney et al. | 361/771 |
| 5,710,071 | A | * | 1/1998 | Beddingfield et al. | 438/108 |
| 6,708,404 | B1 | * | 3/2004 | Gaku et al. | 29/852 |
| 6,734,542 | B2 | * | 5/2004 | Nakatani et al. | 257/687 |
| 2002/0113309 | A1 | * | 8/2002 | Fazelpour | 257/728 |
| 2002/0180062 | A1 | * | 12/2002 | Hsieh et al. | 257/778 |
| 2002/0195662 | A1 | * | 12/2002 | Eden et al. | 257/349 |
| 2003/0034566 | A1 | * | 2/2003 | Jimarez et al. | 257/778 |
| 2003/0043035 | A1 | * | 3/2003 | Flaherty | 340/540 |
| 2004/0084781 | A1 | * | 5/2004 | Ahn et al. | 257/777 |
| 2004/0099441 | A1 | * | 5/2004 | Ichiryu et al. | 174/266 |

* cited by examiner

Primary Examiner—Alexander Oscar Williams
(74) Attorney, Agent, or Firm—Luedeka, Neely & Graham, P.C.

(57) ABSTRACT

An integrated circuit having electrically conductive vias with a diameter of between about one micron and about fifty microns. Prior art vias have a diameter of between no less than 0.3 microns to no more than 0.8 microns. In this manner, stresses such as those that press down upon the top surface of the integrated circuit can be absorbed by the large vias and transferred past fragile layers, such as low k layers, so that the fragile layers are not damaged by the stresses.

4 Claims, 3 Drawing Sheets

VIA CONSTRUCTION FOR STRUCTURAL SUPPORT

FIELD

This invention relates to the field of integrated circuit fabrication. More particularly, this invention relates to designing integrated circuits so as to provide stress protection to layers and structures within the integrated circuit, such as low k material layers.

BACKGROUND

As integrated circuits have become increasingly smaller, electrically conductive structures within the integrated circuits are placed increasingly closer together. This situation tends to enhance the inherent problem of parasitic capacitance between adjacent electrically conductive structures. Thus, new electrically insulating materials have been devised for use between electrically conductive structures, to reduce such capacitance problems. The new electrically insulating materials typically have lower dielectric constants, and thus are generally referred to as low k materials. While low k materials help to resolve the capacitance problems described above, they unfortunately tend to introduce new challenges.

Low k materials are typically filled with small voids that help reduce the material's effective dielectric constant. Thus, there is less of the material itself within a given volume, which tends to reduce the structural strength of the material. The resulting porous and brittle nature of such low k materials presents new challenges in both the fabrication and packaging processes. Unless special precautions are taken, the robustness and reliability of an integrated circuit that is fabricated with low k materials may be reduced from that of an integrated circuit that is fabricated with traditional materials, because low k materials differ from traditional materials in properties such as thermal coefficient of expansion, moisture absorption, adhesion to adjacent layers, mechanical strength, and thermal conductivity.

Concerning the problem of thermal coefficient of expansion, when adjacent layers having different thermal coefficients of expansion are heated and cooled, such as occurs during the normal operation of an integrated circuit, the layers tend to expand and contract at different rates and to different degrees. These forces induce strains in the adjacent and proximal layers. Low k materials tend to have thermal coefficients of expansion that are sufficiently different from those of the other materials used to fabricate integrated circuits, that such strains create problems, which may be both physical and electrical, in the integrated circuit.

As to the problem of moisture absorption, the porosity of low k materials makes them susceptible to absorbing the moisture that typically tends to diffuse into the packaged integrated circuit. As the low k material absorbs such moisture, the properties of the low k material changes. For example, the dielectric constant of the material changes, because the voids tend to fill with water or water vapor. The moisture in the voids may rapidly expand during subsequent heating operations such as baking or solder ball reflow, causing the layers of the integrated circuit to burst apart, resulting in dramatic device failure. The moisture absorbed by the low k material also tends to cause other problems, some of which are described in more detail below.

Integrated circuits containing low k materials are inherently more prone to delamination, either between the various layers of the integrated circuit itself, or between the integrated circuit and packaging materials, such as underfill and mold compound, or other materials which are in intimate contact with the integrated circuit. There are several probable causes for such delamination, including a reduction in the adhesion of a low k layer due to absorption of moisture, as described above. In addition, because the low k material tends to be very porous by nature, there is physically less material available to form adhesive bonds with adjacent layers. Further, the strains induced by differing thermal coefficients of expansion also tend to shear the low k layer from adjacent layers, which again tends to enhance the occurrence of delamination.

As to mechanical strength, low k materials are typically more brittle and have a lower breaking point than other materials. One reason for this is, again, the porosity of the low k material, where a significant percentage of its physical volume is filled with voids. Thus, integrated circuits containing low k materials are inherently more prone to breaking or cracking during processes where physical contact is made with the integrated circuit surface, such as wire bonding and electrical probing, or processes that cause bending stresses such as mold curing, underfill curing, solder ball reflow, or temperature cycling.

Finally, because of their porosity and other properties, low k materials tend to be very poor thermal conductors, typically much less than half a watt per meter-Kelvin (W/mK). This contrasts significantly with the thermal conductivity of traditional integrated circuit and packaging materials such as silicon (60–90 W/mK), copper 380–390 W/mK), mold compound (0.7–2 W/mK), or die attach material (2–4 W/mK). Thus, the thermal energy created during the normal operation of the integrated circuit tends to not be dissipated well by low k materials. Therefore, thermal energy tends to build up within the integrated circuit, and is expressed as localized areas of increased temperature, or hot spots.

There is a need, therefore, for new structures, processes, and materials for use in integrated circuit fabrication, which help to alleviate one or more of the challenges that are enhanced by the use of low k materials.

SUMMARY

Some of the above and other needs are met by an integrated circuit having electrically conductive vias with a diameter of between about one micron and about fifty microns. Prior art vias have a diameter of between no less than 0.3 microns to no more than 0.8 microns. In this manner, stresses such as those that press down upon the top surface of the integrated circuit can be absorbed by the large vias and transferred past fragile layers, such as low k layers, so that the fragile layers are not damaged by the stresses.

In various preferred embodiments, the electrically conductive vias are disposed in one or more of a seal ring of the integrated circuit, active portions of the integrated circuit, and via arrays in corner portions of the integrated circuit. The electrically conductive vias may alternately be either electrically active or electrically inactive. In one embodiment, sets of the electrically conductive vias are disposed in vertical alignment one to another from a top surface of the integrated circuit to a substrate layer of the integrated circuit, thereby transferring loads from the top surface to the substrate without substantially loading any intervening layers.

In an alternate embodiment, the sets of the electrically conductive vias are disposed in an offset alignment one to another from a top surface of the integrated circuit to a substrate layer of the integrated circuit, thereby distributing loads from the top surface either between the substrate and selected intervening layers or to a selected intervening layer. Preferably the electrically conductive vias are formed of metal, and most preferably are formed of copper. In one embodiment all of the vias in the integrated circuit are the large electrically conductive vias. The larger vias are most beneficial when the integrated circuit is a flip chip and is at least about ten millimeters square in size.

Also described herein is a packaged integrated circuit, where the improvement is the integrated circuit having the large vias as described above. Additionally described is an integrated circuit having a die seal ring formed of continuous electrically conductive via rings that extend completely around a peripheral portion of the integrated circuit. Preferably the continuous electrically conductive via rings are disposed in vertical alignment one to another from a top surface of the integrated circuit to a substrate layer of the integrated circuit, thereby transferring loads from the top surface to the substrate without substantially loading any intervening layers. Alternately, the continuous electrically conductive via rings are disposed in an offset alignment one to another from a top surface of the integrated circuit to a substrate layer of the integrated circuit, thereby distributing loads from the top surface between the substrate and selected intervening layers. The continuous electrically conductive via rings may also be interdisposed with separate electrically conductive vias on different layers of the integrated circuit.

A packaged integrated circuit is also described, where the packaged integrated circuit includes a flip chip monolithic integrated circuit that is at least about ten millimeters square in size. Electrically conductive, electrically active vias are disposed in the monolithic circuit, where the electrically conductive vias have a diameter of between about one micron and about fifty microns. The electrically conductive vias are disposed in a seal ring and in via arrays in corner portions of the integrated circuit. Sets of the electrically conductive vias are disposed in vertical alignment one to another from a top surface of the integrated circuit to a substrate layer of the integrated circuit, thereby transferring loads from the top surface to the substrate without substantially loading any intervening layers.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
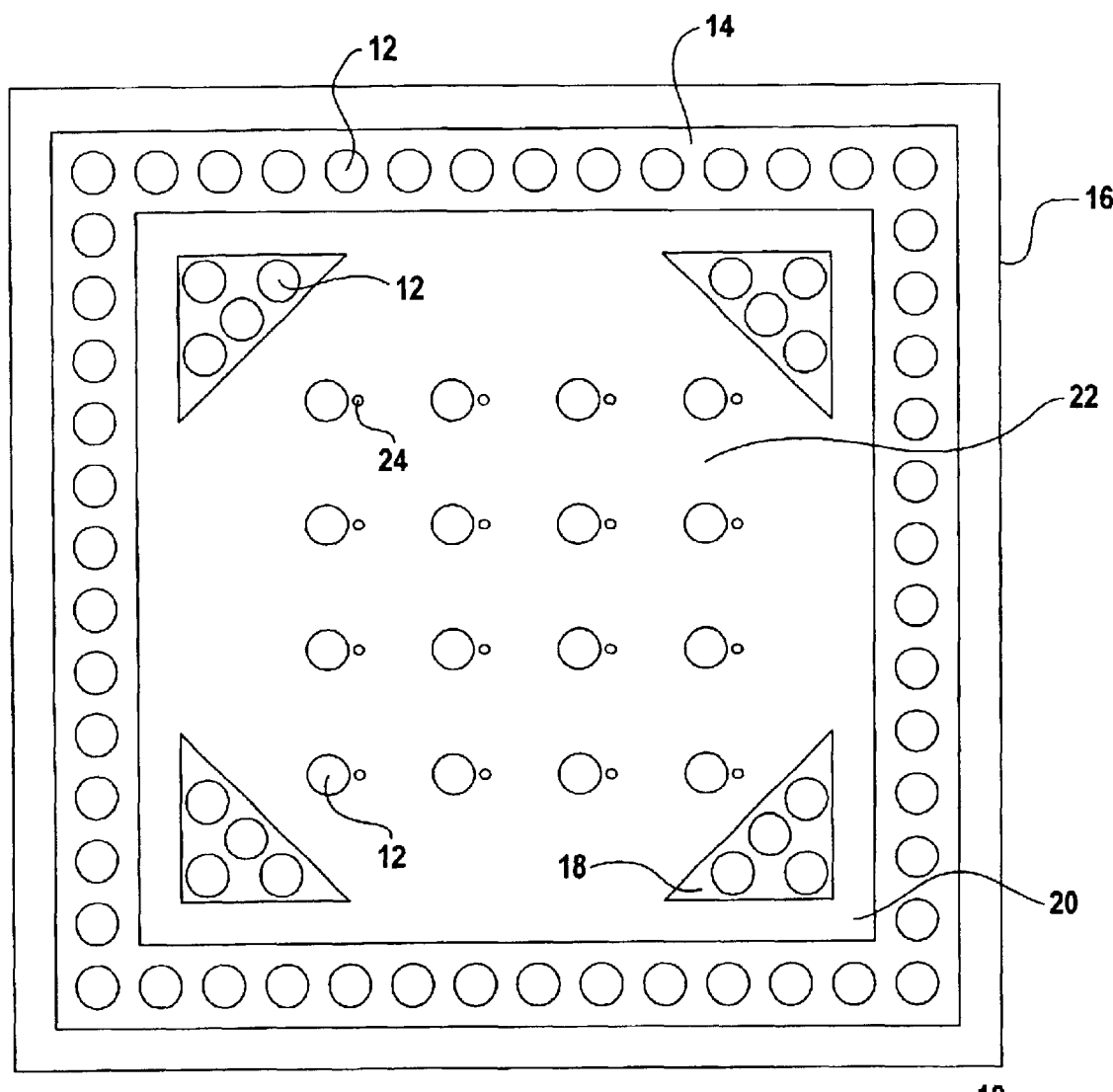
FIG. 1 is a top plan view of an integrated circuit depicting electrically conductive vias according to the present invention.

With reference now to FIG. 1, there is depicted a top plan view of an integrated circuit 10 depicting electrically conductive vias 12 according to the present invention. The electrically conductive vias 12 of the present invention are larger than prior art vias, which typically range in diameter from no less than 0.3 microns to no more than 0.8 microns. By contrast, the electrically conductive vias 12 of the present invention have a diameter of no less than about one micron and no more than about fifty microns, and thus are substantially larger than prior art vias. Thus, the electrically conductive vias 12 of the present invention are able to bear and distribute stresses, such as those produced externally to the integrated circuit 10 and which press down upon the upper surface of the integrated circuit 10.

The electrically conductive vias 12 are preferably formed of metal, and are most preferably formed of copper. The electrically conductive vias 12 may be either electrically active, meaning that they are used to conductive signals, power, or ground through the integrated circuit 10, or electrically inactive, meaning that they are not used to conductive signals, power, or ground through the integrated circuit 10. The electrically conductive vias 12 may be disposed in an interior portion 22 of the integrated circuit 10, and may be paired with traditional vias 24. In such a configuration, the electrically conductive vias 12 may provide structural support alone, redundant electrically active operation in addition to the traditional vias 24, or primary electrically active operation to the integrated circuit 10.

The electrically conductive vias 12 may also be placed in specially designed arrays 18, such as in the corner portions 20 of the integrated circuit 10, where stresses tend to be the greatest on a packaged integrated circuit 10. Such stresses are especially prevalent on relatively larger integrated circuits 10, such as those that are at least about ten millimeters square in size. The electrically conductive vias 12 may also be placed in a die seal ring 14 near the peripheral edges 16 of the integrated circuit 10. In this manner, the via density in the die seal ring 14 is increased, due to the larger size of the electrically conductive vias 12, which tends to improve the transfer of stress from the surface of the integrated circuit 10 to layers within the integrated circuit 10 that are more able to bear the stress, and away from layers that are less able to bear the stress, such as low k layers.

Figure 2:
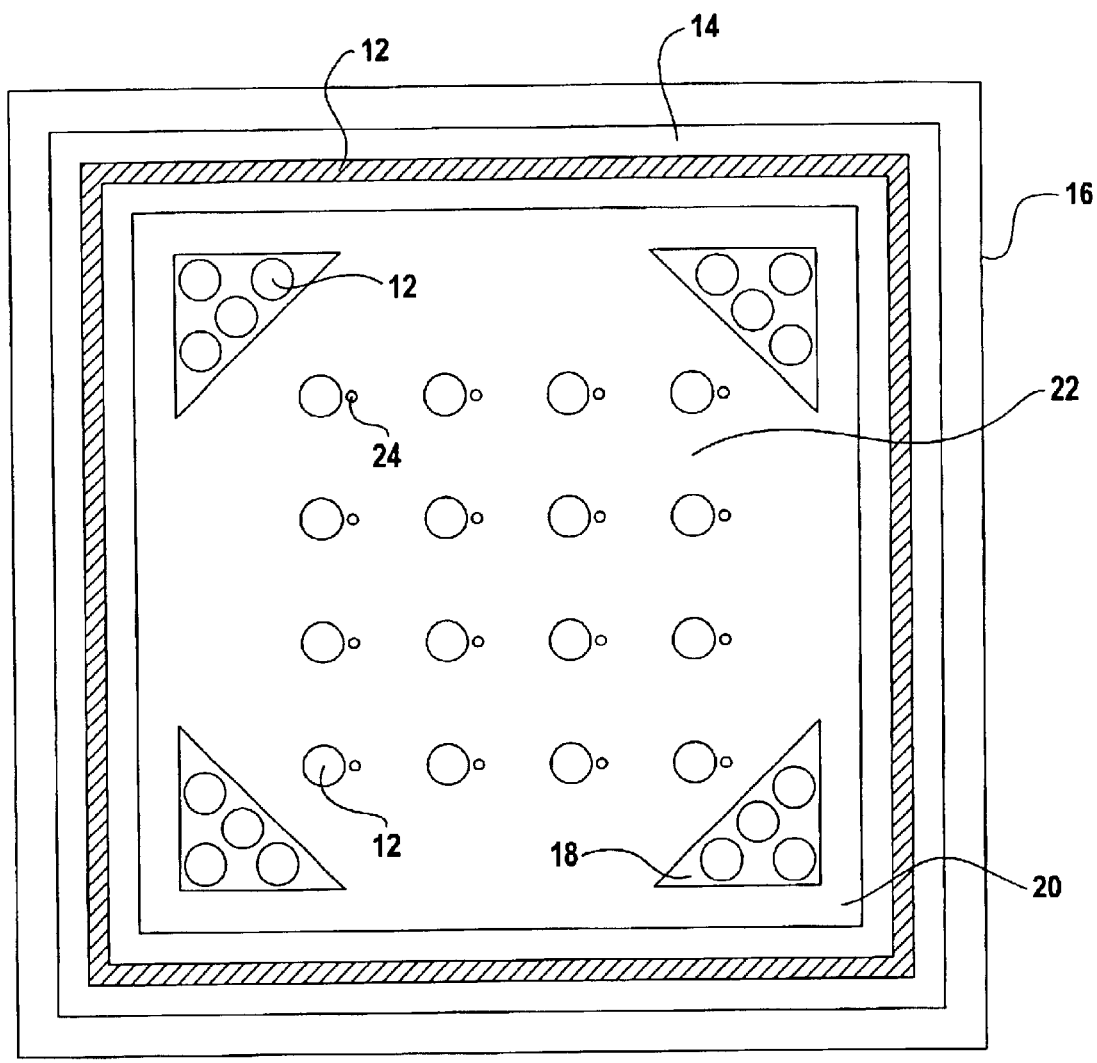
FIG. 2 is a top plan view of an integrated circuit depicting continuous via rings in a die seal ring according to the present invention.

FIG. 2 depicts an integrated circuit 10 where the electrically conductive via 12 in the die seal ring 14 has the form of a continuous ring, rather than a plurality of separate vias. It is appreciated that some of the electrically conductive vias 12 may be in the form of a ring via 12 in the die seal ring 14, and others of the electrically conductive vias 12 may be in the separate via form as depicted in the interior 22 of the integrated circuit 10 and in the arrays 18 in the corners 20 of the integrated circuit 10. It is further appreciated that some of the electrically conductive vias 12 may be electrically active and others of the electrically conductive vias 12 may be electrically inactive.

Figure 3:
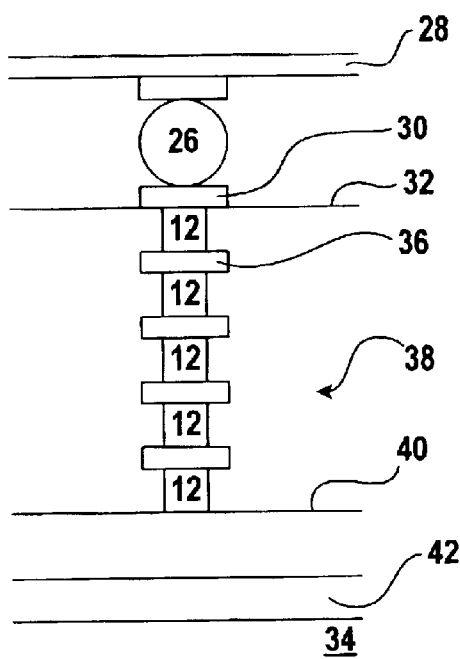
FIG. 3 is a cross sectional view of a portion of a packaged integrated circuit depicting aligned sets of electrically conductive vias.

With reference now to FIG. 3, there is depicted a cross sectional view of a portion of a packaged integrated circuit 34, including a package substrate 28, electrical connection 26 between the package substrate 28 and an electrical contact 30 on the surface 32 of the integrated circuit 10, and a stack of electrically conductive vias 12 formed between electrically conductive traces 36. In the embodiment depicted in FIG. 3, the via stack is formed in a vertical alignment from the contact 30 to the substrate 40 of the integrated circuit 10, and is formed through a variety of different layers 38, which are not separately distinguished in FIG. 3. A casing 42 is disposed against the backside of the integrated circuit 10.

In the embodiment depicted in FIG. 3, the vertical alignment of the via stack tends to transfer loads from the upper surface 32 of the integrated circuit 10 directly to the substrate 40 on which the electrically conductive vias 12 are based. Thus, the via stack acts like a structural pillar support, and any intervening layers, such as low k layers, are not unduly loaded from stresses placed on the upper surface 32 of the integrated circuit 10.

Figure 4:
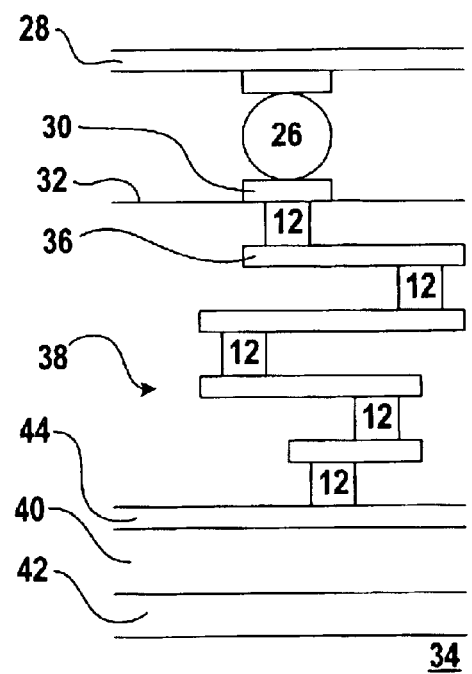
FIG. 4 is a cross sectional view of a portion of a packaged integrated circuit depicting offset sets of electrically conductive vias.

FIG. 4 depicts an alternate embodiment where the via stack is disposed in an offset alignment, and the stresses are transferred to one or more intervening layers 38, either in place of or in addition to transferring the load to either the substrate 40 or an overlying oxide layer 44. It is appreciated that the load could be transferred to an oxide or other base layer 44 in the embodiment of FIG. 3 as well, instead of directly to the substrate 40, and the load could be at least partially transferred directly to the substrate 40 in the embodiment of FIG. 4. The offset alignment of the via stack as depicted in FIG. 4 allows the load to be either evenly distributed throughout the layers 38, and thus ensuring that no one layer has too much of a load, or distributed to a selected subset of the layers 38 and not to the other layers, and thereby ensuring that the other layers, such as weaker low k layers, are not burdened with too much of a load.

It is further appreciated that a combination of the continuous via rings as depicted in the FIG. 2 and the separate vias as depicted in FIG. 1 can be used on the different layers down through the integrated circuit 10. Additionally, either a greater number of smaller vias 12 or a smaller number of larger vias 12 may be used to provide the desired support. In addition, the via stacks as depicted in FIGS. 3 and 4 need not be connected to the package substrate 28 by electrical connections 26, such as the solder bump depicted. In such an embodiment, the volume that is taken with the electrical connection 26 will instead be filled with an underfill or other potting material, which also produces stress against the top surface 32 of the integrated circuit 10.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. In a packaged integrated circuit having a flip chip monolithic integrated circuit that is at least about ten millimeters square in size, the improvement comprising electrically conductive, electrically active vias disposed in the monolithic circuit, the electrically conductive vias having a diameter of between about one micron and about fifty microns, where the electrically conductive vias are disposed in a seal ring and in via arrays in corner portions of the integrated circuit, wherein sets of the electrically conductive vias are disposed in vertical alignment one to another from a top surface of the integrated circuit to a substrate layer of the integrated circuit, thereby transferring loads from the top surface to the substrate without substantially loading any intervening layers.

2. The integrated circuit of claim 1, wherein the electrically conductive vias are formed of metal.

3. The integrated circuit of claim 1, wherein the electrically conductive vias are formed of copper.

4. The integrated circuit of claim 1, wherein the electrically conductive vias comprise all vias in the integrated circuit.

* * * * *